(12) United States Patent
Chidambarrao et al.

(10) Patent No.: US 8,368,125 B2
(45) Date of Patent: Feb. 5, 2013

(54) MULTIPLE ORIENTATION NANOWIRES WITH GATE STACK STRESSORS

(75) Inventors: Dureseti Chidambarrao, Weston, CT (US); Xiao Hu Liu, Briarcliff Manor, NY (US); Lidija Sekaric, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 448 days.

(21) Appl. No.: 12/505,580

(22) Filed: Jul. 20, 2009

(65) Prior Publication Data

US 2011/0012176 A1 Jan. 20, 2011

(51) Int. Cl.
*H01L 27/085* (2006.01)

(52) U.S. Cl. ......... 257/255; 257/E21.209; 257/E29.255; 438/157; 438/198

(58) Field of Classification Search .......... 257/E21.409, 257/E29.255; 438/157, 198
See application file for complete search history.

(56) References Cited

U.S. PATENT DOCUMENTS

| | | | |
|---|---|---|---|
| 6,231,744 B1 | 5/2001 | Ying et al. | 205/324 |
| 6,248,674 B1 | 6/2001 | Kamins et al. | 438/798 |
| 6,656,573 B2 | 12/2003 | Chen et al. | 428/195 |
| 6,720,240 B2 | 4/2004 | Gole et al. | 438/487 |
| 6,798,000 B2 | 9/2004 | Luyken et al. | 257/213 |
| 6,831,017 B1 | 12/2004 | Li et al. | 438/694 |
| 6,841,235 B2 | 1/2005 | Weiner et al. | 428/320.2 |
| 6,843,902 B1 | 1/2005 | Penner et al. | 205/76 |
| 6,882,051 B2 | 4/2005 | Majumdar et al. | 257/746 |
| 6,897,098 B2 | 5/2005 | Hareland et al. | 438/128 |
| 6,969,679 B2 | 11/2005 | Okamura et al. | 438/666 |
| 6,982,196 B2 | 1/2006 | Belyansky et al. | 438/199 |
| 6,996,147 B2 | 2/2006 | Majumdar et al. | 372/43 |
| 6,998,333 B2 | 2/2006 | Chen et al. | 438/607 |
| 7,067,328 B2 | 6/2006 | Dubrow et al. | 438/1 |
| 7,067,341 B2 | 6/2006 | Mascolo et al. | 438/48 |
| 7,081,293 B2 | 7/2006 | Weiner et al. | 428/320.2 |

(Continued)

FOREIGN PATENT DOCUMENTS

WO WO-2008/034850 A2 3/2008

OTHER PUBLICATIONS

Jiang y et al: "Nanowire FETS for low power CMOS applications featuring novel gate-all-around single metal FUSI gates with dual $\Phi m$ $V_T$ Tune-ability" IDEM 2008.IEEE International Electron Devices Meetings. Technical Digest IEEE Piscataway, NJ, USA, International Electron Devices Meeting. IDEM Technical Digest, Dec. 15, 2008, pp. 1-4, XP031434591.

(Continued)

*Primary Examiner* — Telly Green
(74) *Attorney, Agent, or Firm* — Harrington & Smith; Louis J. Percello

(57) ABSTRACT

An electronic device includes a conductive channel defining a crystal structure and having a length and a thickness $t_C$; and a dielectric film of thickness $t_g$ in contact with a surface of the channel. Further, the film comprises a material that exerts one of a compressive or a tensile force on the contacted surface of the channel such that electrical mobility of the charge carriers (electrons or holes) along the channel length is increased due to the compressive or tensile force in dependence on alignment of the channel length relative to the crystal structure. Embodiments are given for chips with both hole and electron mobility increased in different transistors, and a method for making such a transistor or chip.

10 Claims, 19 Drawing Sheets

U.S. PATENT DOCUMENTS

| | | | |
|---|---|---|---|
| 7,091,563 B2 | 8/2006 | Chidambarrao et al. | 257/369 |
| 7,129,126 B2 | 10/2006 | Steegen et al. | 438/199 |
| 7,135,728 B2 | 11/2006 | Duan et al. | 257/296 |
| 7,164,209 B1 | 1/2007 | Duan et al. | 257/784 |
| 7,176,505 B2 | 2/2007 | Rueckes et al. | 257/209 |
| 7,182,996 B2 | 2/2007 | Hong | 428/209 |
| 7,183,568 B2 | 2/2007 | Appenzeller et al. | 257/7 |
| 7,189,635 B2 | 3/2007 | Sharma | 438/584 |
| 7,205,206 B2 | 4/2007 | Belyansky et al. | 438/424 |
| 7,208,094 B2 | 4/2007 | Islam et al. | 216/2 |
| 7,211,464 B2 | 5/2007 | Lieber et al. | 438/99 |
| 7,217,946 B2 | 5/2007 | Fraboulet et al. | 257/9 |
| 7,262,501 B2 | 8/2007 | Duan et al. | 257/750 |
| 7,268,049 B2 | 9/2007 | Zhu et al. | 438/300 |
| 7,326,997 B2 | 2/2008 | Zhu et al. | 257/351 |
| 7,763,505 B2 * | 7/2010 | Gehring et al. | 438/187 |
| 7,811,876 B2 * | 10/2010 | Scott et al. | 438/199 |
| 2002/0014667 A1 | 2/2002 | Shin et al. | 257/368 |
| 2004/0136866 A1 | 7/2004 | Pontis et al. | 422/57 |
| 2004/0209468 A1 | 10/2004 | Kumar et al. | 438/689 |
| 2005/0253137 A1 | 11/2005 | Whang et al. | 257/40 |
| 2006/0081886 A1 | 4/2006 | Mostarshed et al. | 257/213 |
| 2006/0105513 A1 | 5/2006 | Afzali-Ardakani et al. | 438/197 |
| 2006/0151844 A1 | 7/2006 | Avouris et al. | 257/411 |
| 2006/0175671 A1 | 8/2006 | Cao | 257/410 |
| 2007/0004224 A1 | 1/2007 | Currie | 438/778 |
| 2007/0105321 A1 | 5/2007 | Lee et al. | 438/270 |
| 2007/0190708 A1 | 8/2007 | Kaneko et al. | 438/157 |
| 2008/0014689 A1 | 1/2008 | Cleavelin et al. | 438/197 |
| 2008/0017913 A1 | 1/2008 | Yoon et al. | 257/315 |
| 2010/0025743 A1 * | 2/2010 | Hoentschel et al. | 257/288 |

OTHER PUBLICATIONS

Pott V. et al: "Fabrication and Characterization of Gate-All-Around Silicon Nanowires on Bulk Silicon" IEEE Transactions on Nanotechnology, IEEE Service Center, Piscataway, NJ, US LNKD-DOI: 10.1109/TNANO.2008.2007215, vol. 7, No. 6, Nov. 1, 2008, pp. 733-744, XP011237450.

Singh N et al: "Observation of Metal-Layer Stress on Si Nanowires in Gate-All-Around High-/Metal-gate Device Structures" IEEE Electron Device Letters, IEEE Service Center, New York, NY, US LNKD-DOI: 10.1109/LED.2007.899330, vol. 28, No. 7, Jul. 1, 2007, pp. 558-561, XP011186083.

"Device Integration Issues Towards 10 nm MOSFETs", Mikael Ostling et al., IEEE 2006, 6 pages.

"Package-strain-enhanced device and circuit performance", S. Maikap et al., IEEE 2004, 4 pages.

"Strain Controlled CMOSFET with Phase Controlled Full-silicide (PC-FUSI) HfSiON Gate Stack Structure for 45nm-node LSTP Devices", Motofumi Saitoh et al., IEEE 2006.

* cited by examiner

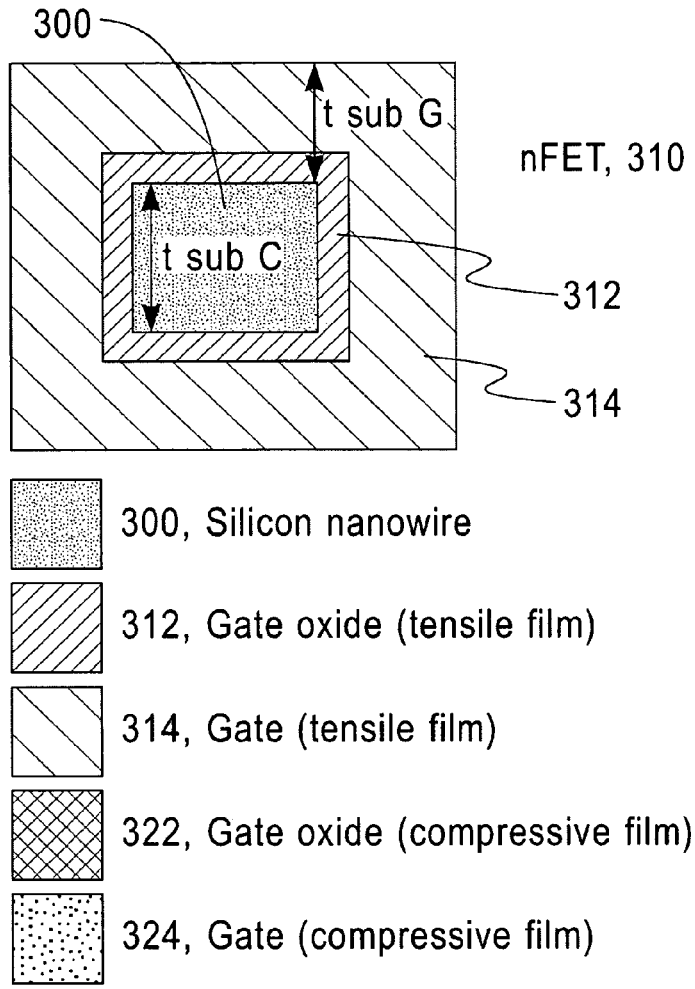
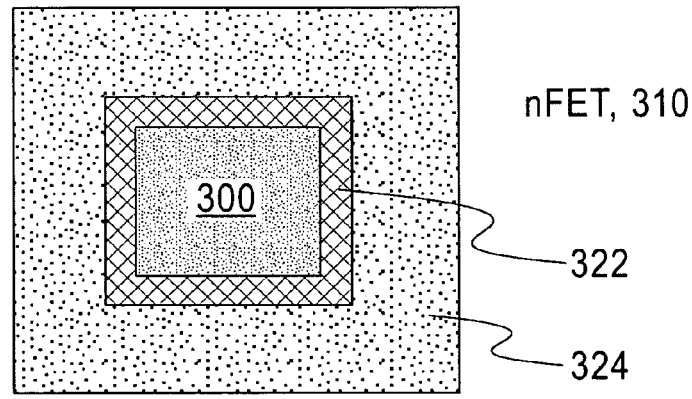
FIG. 3

Piezoelectric coefficients (bulk) in <110> oriented NWs

| Top/bottom surfaces | $\pi_L$ (1-10) | $\pi_V$ (001) | $\pi_T$ (110) |
| --- | --- | --- | --- |
| nFET | -31.6 | 53.4 | -17.6 |
| pFET | 71.8 | -1.1 | -66.3 |
| Left/right surfaces | $\pi_L$ (110) | $\pi_V$ (1-10) | $\pi_T$ (001) |
| nFET | -31.6 | -17.6 | 53.4 |
| pFET | 71.8 | -66.3 | -1.1 |

FIG. 5A

Piezoelectric coefficients (bulk) for <100> wires

| Top/bottom surfaces | $\pi_L$ (1-10) | $\pi_V$ (001) | $\pi_T$ (110) |
| --- | --- | --- | --- |
| nFET | -102 | 53.4 | 53.4 |
| pFET | 6.6 | -1.1 | -1.1 |
| Left/right surfaces | $\pi_L$ (110) | $\pi_V$ (1-10) | $\pi_T$ (001) |
| nFET | -102 | 53.4 | 53.4 |
| pFET | 6.6 | -1.1 | -1.1 |

FIG. 5B

Mobility delta in <110> wires

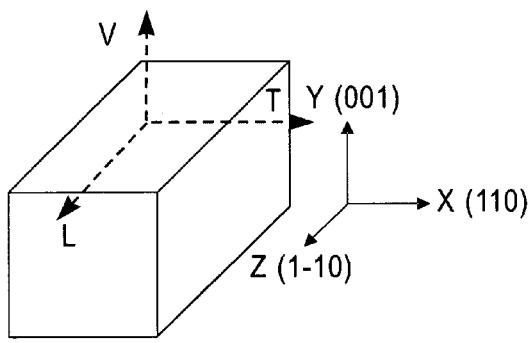
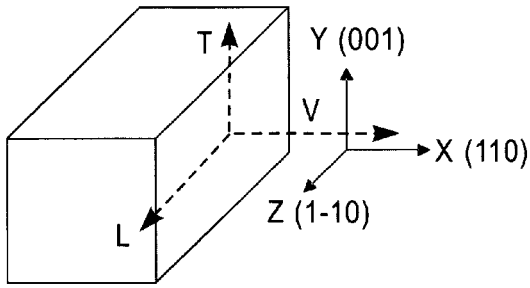

NW top/bottom surfaces $\delta\mu = -\pi_T\sigma_T - \pi_V\sigma_V - \pi_L\sigma_L$
$\quad = -\pi_T\sigma_X - \pi_V\sigma_Y - \pi_L\sigma_Z$ NW left/right surfaces $\delta\mu = -\pi_T\sigma_T - \pi_V\sigma_V - \pi_L\sigma_L$
$\quad = -\pi_T\sigma_Y - \pi_V\sigma_X - \pi_L\sigma_Z$

FIG. 6A

Mobility delta in <100> wires

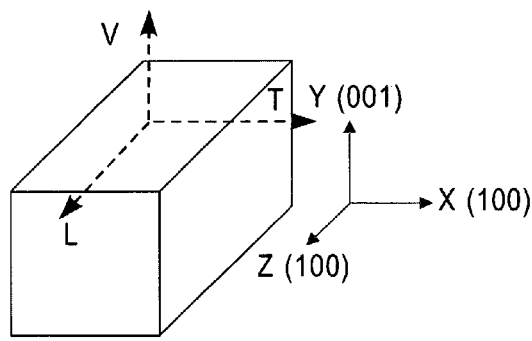
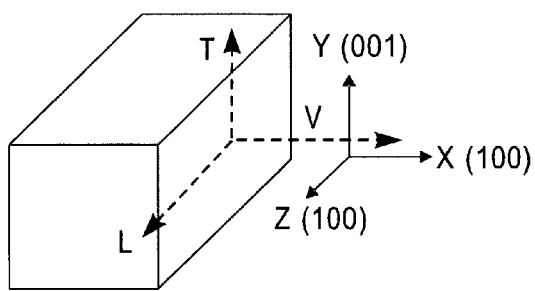

NW top/bottom surfaces $\delta\mu = -\pi_T\sigma_T - \pi_V\sigma_V - \pi_L\sigma_L$
$\quad = -\pi_T\sigma_X - \pi_V\sigma_Y - \pi_L\sigma_Z$ NW left/right surfaces $\delta\mu = -\pi_T\sigma_T - \pi_V\sigma_V - \pi_L\sigma_L$
$\quad = -\pi_T\sigma_Y - \pi_V\sigma_X - \pi_L\sigma_Z$

FIG. 6B

Potential Mobility delta for compressive films

<100> nFET $\delta\mu_{20\times20} = 0.5 * (\delta\mu_{T/B} + \delta\mu_{L/R}) = \underline{-9278}$ pFET $\delta\mu_{20\times20} = 0.5 * (\delta\mu_{T/B} + \delta\mu_{L/R}) = \underline{-275}$

<110> nFET $\delta\mu_{20\times20} = 0.5 * (\delta\mu_{T/B} + \delta\mu_{L/R}) = \underline{-4059}$ pFET $\delta\mu_{20\times20} = 0.5 * (\delta\mu_{T/B} + \delta\mu_{L/R}) = \underline{7604}$

FIG. 7

Potential Mobility delta for tensile films

<100> nFET $\delta\mu_{20\times20} = 0.5 * (\delta\mu_{T/B} + \delta\mu_{L/R}) = \underline{9278}$ pFET $\delta\mu_{20\times20} = 0.5 * (\delta\mu_{T/B} + \delta\mu_{L/R}) = \underline{275}$

<110> nFET $\delta\mu_{20\times20} = 0.5 * (\delta\mu_{T/B} + \delta\mu_{L/R}) = \underline{4059}$ pFET $\delta\mu_{20\times20} = 0.5 * (\delta\mu_{T/B} + \delta\mu_{L/R}) = \underline{-7604}$

FIG. 8

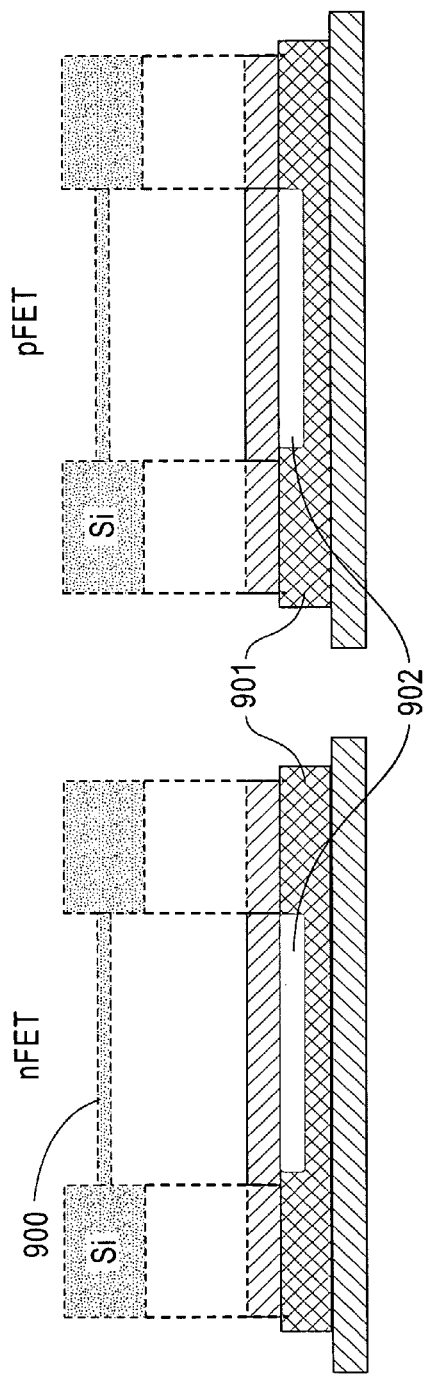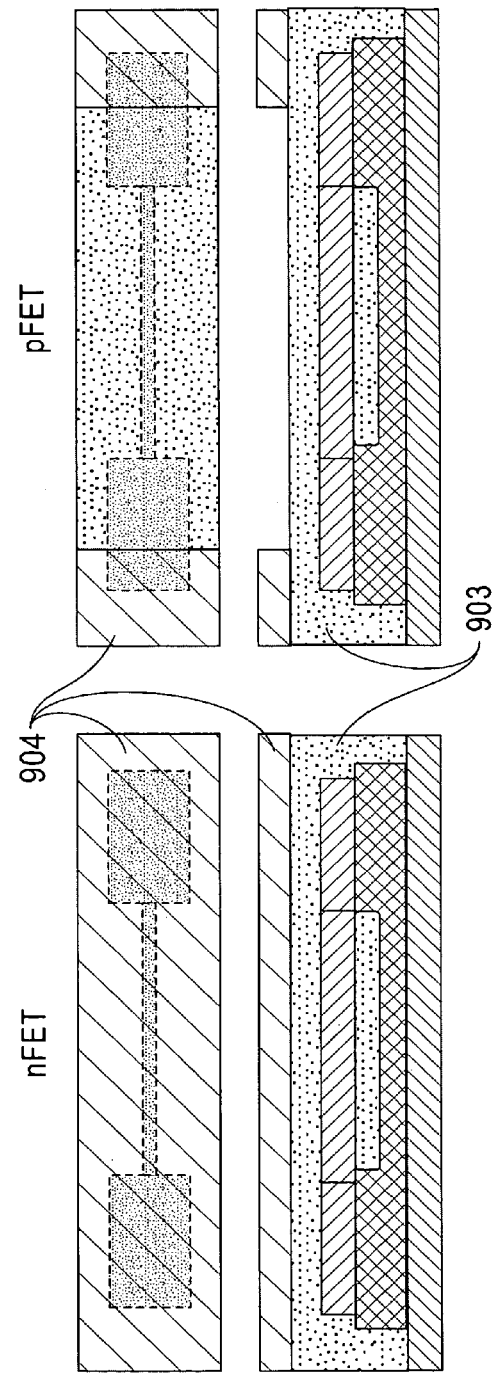
FIG. 9A
FIG. 9B

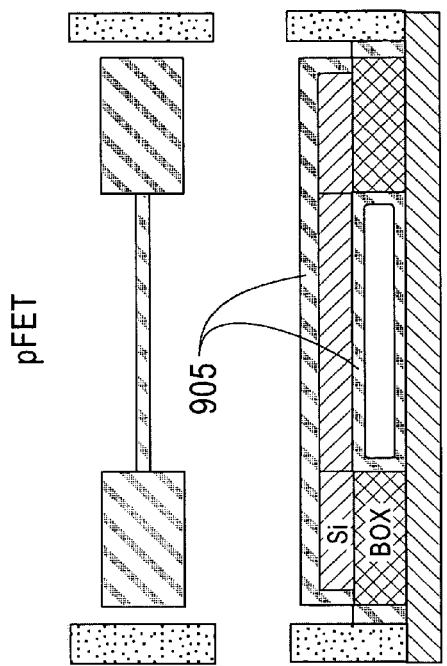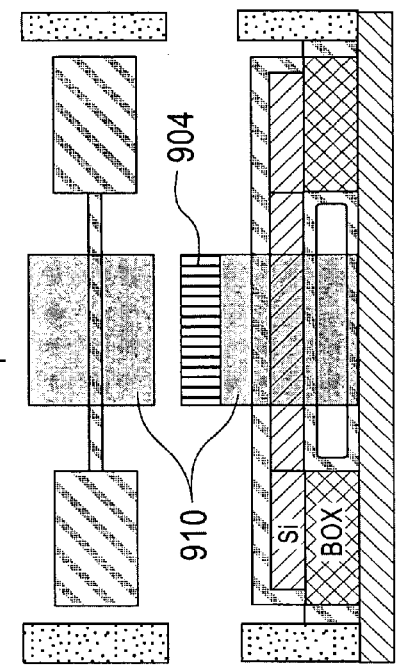
FIG. 9C  FIG. 9D

MULTIPLE ORIENTATION NANOWIRES WITH GATE STACK STRESSORS

CROSS REFERENCE TO RELATED APPLICATION

This application includes subject matter related to U.S. patent application Ser. No. 12/505,603 filed the same day as this application. The contents of that related application are hereby incorporated by reference in its entirety.

TECHNICAL FIELD

The exemplary and non-limiting embodiments of this invention relate generally to electronic devices such as transistors and their manufacture, of which such devices may be formed on a semiconductor wafer or chip.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

The traditional transistor includes a channel, which conducts current between a source and a drain, and a gate which controls flow of that current through the channel. Transistors are generally termed field effect transistors, or FETs. There are two predominant types depending on the type of dopant used in their fabrication: n-FETs and p-FETs. While there are many variations applicable to either type, including FinFETs which increase electron and hole mobility in the channel, and multi-gate structures which better control the current, this general paradigm holds true for them all.

As transistors have become smaller in size and the currents they convey become commensurately smaller, it has become more important to control for current leakage via the semiconductor substrate which lies below the channel by disposing the gate on more than simply the top surface of the channel as was done with early transistors. The most effective gate control is therefore disposing the gate fully about the cross sectional profile of the channel. This is shown at FIG. 1A. The channel 10 is shown as a nanowire reflecting its small diameter, on the order of tens of nanometers or less. This is fully enveloped by the polysilicone gate 14 with an interstitial layer of gate oxide 12 lying there between to enhance electrical coupling of the gate material 14 to the channel 10. FIG. 1B is a micrograph showing a sectional view of multiple beams which are a part of the same channel. FIG. 1C is a micrograph showing a plan view of a transistor with source, gate and drain labeled; current flows from source to drain through a channel that lies under the illustrated gate. FIG. 1D is the cross-section through the gate from micrograph in FIG. 1C. The channel 10 is shown and the gate dielectric and gate are illustrated as a combined gate stack 16.

It is noted that the wire which forms a transistor channel 10 is not restricted to the circular shape of a traditional wire as FIGS. 1A-1D illustrate; it is common to employ rectilinear channels with definite sidewall, top and bottom surfaces against which the gate and gate oxide is disposed. Representative but non-limiting dimensions for such rectilinear nanowires are on the order of 20 nm or less wide and thick. The gate length will be determined by the application of the nanowire device and can range from 5 nm to a few microns. The gate oxide or other gate dielectric would be disposed at a thickness on the order of about a few nanometers at most and the gate itself would run to a thickness of no more than 100 nm. Such dimensions are operable for both n-FET and p-FET devices.

The continuing reduction is transistor size results in the need for better gate control and for more precise metering of smaller and smaller currents. Nano-scale channels and gates are being developed to satisfy the need for smaller physical size. What is needed is a more effective electrical conduit for the channel to meet increasingly stringent demands of speed and slight current.

SUMMARY

The foregoing and other problems are overcome, and other advantages are realized, by the use of the exemplary embodiments of this invention.

In a first exemplary aspect of the invention there is provided an electronic device that includes a conductive channel defining a crystal structure and having a length and a thickness $t_C$; and a dielectric film of thickness $t_g$ in contact with a surface of the channel. The dielectric film has a thickness $t_G$ such that the ratio $t_G/t_C$ is greater than or equal to 0.1. Further, the film comprises a material that exerts one of a compressive or a tensile force on the contacted surface of the channel such that electrical mobility of the charge carriers (electrons or holes) along the channel length is increased due to the compressive or tensile force in dependence on alignment of the channel length relative to the crystal structure.

In a second exemplary aspect of the invention there is provided a semiconductor chip that includes a first n-type transistor and a second p-type transistor. The first n-type transistor has a first channel and a first gate stack in contact with a surface of the first channel. The first channel has a length $l_1$ along a first orientation of a crystal structure of the semiconductor chip and a thickness $t_{C1}$. The second p-type transistor has a second channel and a second gate stack in contact with a surface of the second channel. The second channel has a length $l_2$ along a second orientation of a crystal structure of the semiconductor chip and a thickness $t_{C2}$. The first gate stack exerts a tensile force on the contacted surface of the first channel such electrical mobility of charge carriers (electrons in this instance) along the first channel length $l_1$ is increased due to the tensile force in dependence on the first orientation. Further, the second gate stack exerts a compressive force on the contacted surface of the second channel such that the electrical mobility of charge carriers (holes in this instance) along the second channel length 12 is increased due to the compressive force in dependence on the second orientation.

In a third exemplary aspect of the invention there is provided a method that includes forming on a semiconductor substrate a nanowire first channel for a n-FET device having a first crystal orientation along a length of the first channel and a first thickness $t_{C1}$. The method further includes forming a nanowire second channel for a p-FET device having a second crystal orientation along a length of the second channel and a second thickness $t_{C2}$. These nanowires may be formed simultaneously or separate from one another, in any order. Further, the method includes disposing over a surface of the first nanowire a gate dielectric and a gate having a thickness $t_{G1}$ and made of materials selected to impose a net tensile force on the surface of the first nanowire. Also the method includes disposing over a surface of the second nanowire a gate dielectric and a gate having a thickness $t_{G2}$ and made of materials selected to impose a net compressive force on the surface of the second nanowire. These disposing steps may be done simultaneously or in any order. The first crystal orientation is selected such that the net tensile force operates to increase electric mobility of charge carriers (electrons in this case) along the length of the first nanowire. Also, the second crystal orientation is selected such that the net compressive force operates to increase electric mobility of charge carriers (holes in this case) along the length of the second nanowire. Such mobility increase can be readily measured by applying a voltage across the length of the respective channels.

BRIEF DESCRIPTION OF THE DRAWINGS

FIG. 3 is a schematic sectional diagram of a n-FET and a pFET with gate stack electrodes according to two exemplary embodiments of the invention.

FIG. 5A is a chart listing piezoelectric coefficients for bulk silicon nanowires having a <110> orientation.

FIG. 5B is a chart listing piezoelectric coefficients for bulk silicon nanowires having a <100> orientation.

FIG. 6A illustrate different surfaces of a <110> oriented nanowire channel and equations for computing electron/hole mobility change.

FIG. 6B illustrate different surfaces of a <100> oriented nanowire channel and equations for computing electron/hole mobility change.

FIG. 7 is a quantitative analysis for n-FETs and P-FETs with <100> and <110> orientations showing electron/hole mobility change due to a gate stack of compressive films according to embodiments of the invention.

FIG. 8 is a quantitative analysis for n-FETs and P-FETs with <100> and <110> orientations showing electron/hole mobility change due to a gate stack of tensile films according to embodiments of the invention.

FIGS. 9A-9L illustrate select process steps for making a semiconductor chip having an n-FET and a p-FET according to an exemplary embodiment of the invention.

DETAILED DESCRIPTION

Figure 2A:
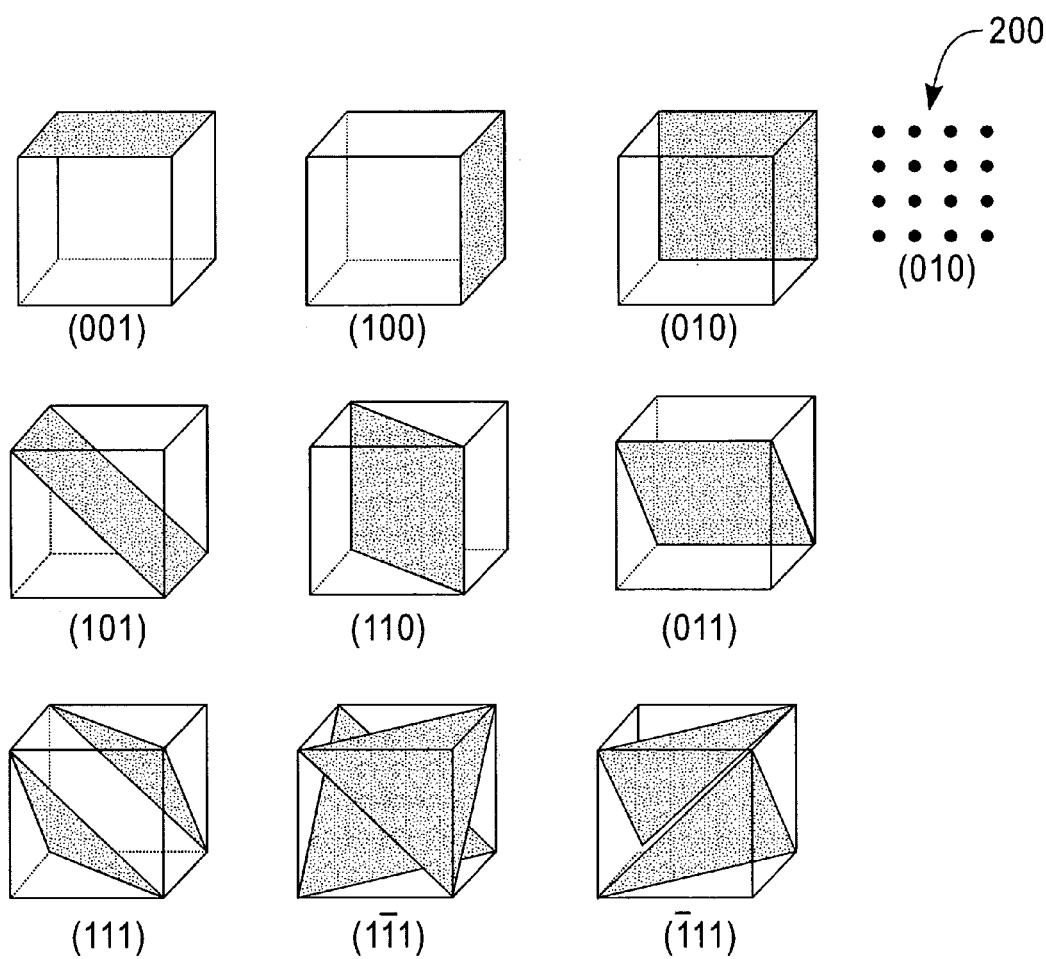
FIG. 2A is a set of schematic diagrams showing conventional Miller index orientations.

When discussing semiconductors on such a small scale as nanowire devices, it is convenient to employ a directional convention that depends on the crystalline lattice alignment rather than a generic x-y-z Cartesian system. One well known convention that depends on the lattice alignment of the underlying material employs Miller indices. To avoid confusion between Miller index and reference numbers used herein for the figures, Miller indices as used herein are enclosed in parentheses ( ) or carats < >. FIG. 2A is a set of schematic diagrams showing conventional Miller index orientations. The crystal structure can be seen at 200, where the plane defined by that crystal face is the (110) plane of the crystal. Generally and as shown at FIG. 2A for a rectilinear/cubic lattice structure such as that present in silicon and many silicon compounds (SiGe, SiGa, etc.), the (010) direction is aligned with one of the faces of the cubic lattice, the (100) direction is perpendicular to the (010) direction and aligned with a different face of the cubic lattice, and the (111) direction is 45 degrees offset to run at a diagonal to both the (010) and (100) faces of the lattice. Unlike a Cartesian-type system which has an origin and positive/negative directions, there is no origin or positive/negative directions in the Miller index paradigm and so each direction identified by a Miller index is a series of parallel planes.

Figure 2B:
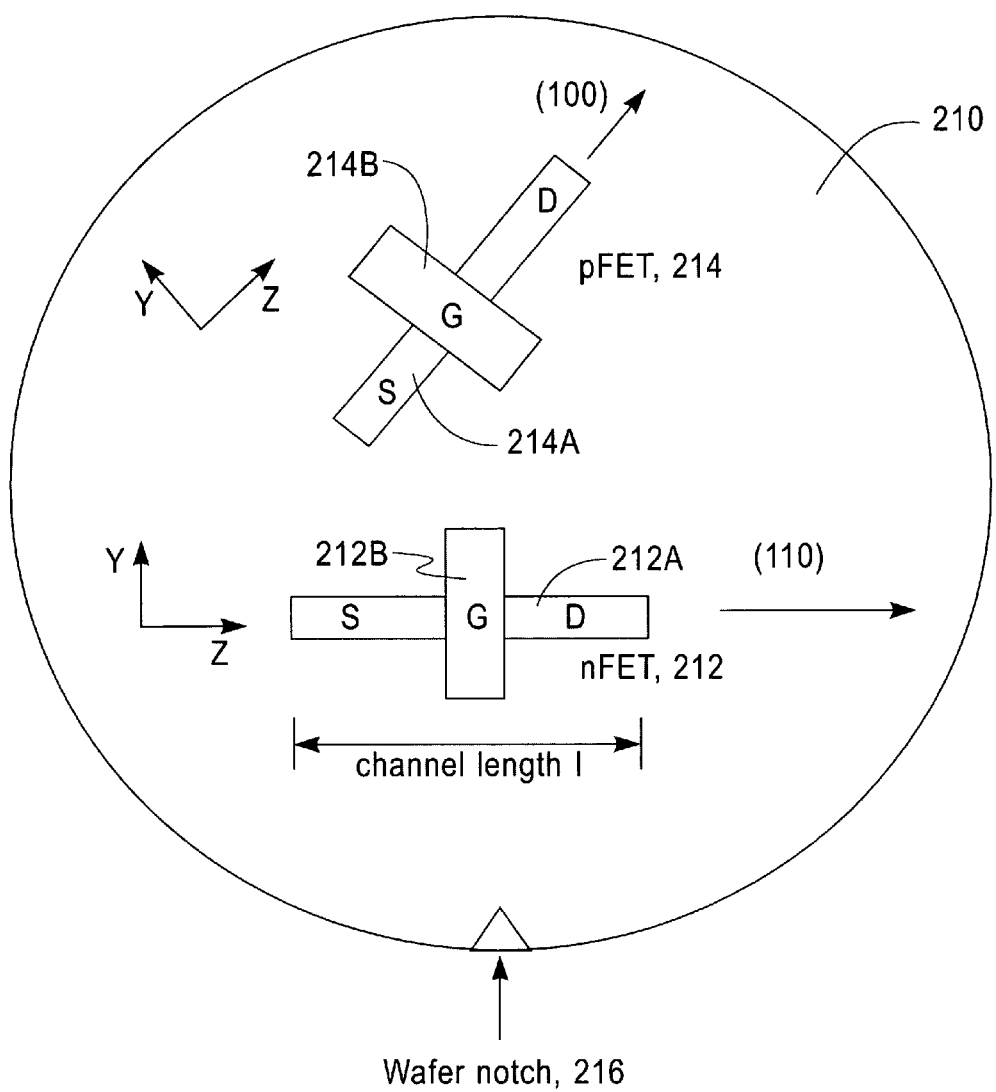
FIG. 2B is a schematic diagram showing an exemplary n-FET and a p-FET formed on a semiconductor substrate and having different Miller index orientations.

FIG. 2B illustrates two types of FETs 212, 214 formed on a silicon wafer 210. A commonly used wafer, given as an example, is cut to produce crystal orientations of (100) out of plan of the wafer along with the indicated (100)-equivalent and (110)-equivalent directions 45 degrees from each other. For the n-FET 212, the channel 212A between source S and drain D is aligned with the (110) direction. For the p-FET 214, the channel 214A between source S and drain D is aligned with the (100).

Two particular embodiments of the invention are shown in FIG. 3, each showing a sectional view of a nanowire channel 300 of the type of transistor shown in FIG. 2B and in the given orientation, with the gate oxide and gate disposed about all sides of the gate. While a square channel 300 is shown, this is not a limitation but as detailed below is a convenient way to describe mathematically how mobility in the channel is enhanced by this invention. It is also not necessary that the gate be disposed fully about the channel; advantages may be gained with the gate disposed on only one side or on two or more sides of the channel 300, though as will be seen the electron/hole mobility through the channel is enhanced to a greater degree with the gate disposed over the highest surface area of the channel 300.

For an n-FET device 310, electron mobility in the channel 300 is increased when the electrode gate stack, which includes the gate oxide 312 and the gate 314, exerts a tensile force on the channel 300. Therefore the gate oxide/gate dielectric 312 and the gate 314 are tensile films. Exemplary but non-limiting materials for the gate dielectric 312 in the n-FET embodiment include tensile oxynitride and halfnium oxide ($HfO_2$). Exemplary but non-limiting materials for the gate 314 in the n-FET embodiment include titanium nitride (TiN), tantalum nitride (TaN) and tensile polysilicon. In an exemplary embodiment, the gate stack includes at least one of the above tensile gate dielectric materials and at least one of the above tensile gate materials.

For a p-FET device 320, hole mobility in the channel 300 is increased when the electrode gate stack (the gate oxide 322 and the gate 324) exerts a compressive force on the channel 300. Therefore the gate oxide/gate dielectric 322 and the gate 324 are compressive films. Exemplary but non-limiting materials for the gate dielectric 322 in the p-FET embodiment include standard thermal oxide and compressive oxynitride. An exemplary but non-limiting material for the gate 324 in the p-FET embodiment include polysilicon. In an exemplary embodiment, the gate stack includes at least one of the above compressive gate dielectric materials and at least one of the above compressive gate materials.

Figure 4A:
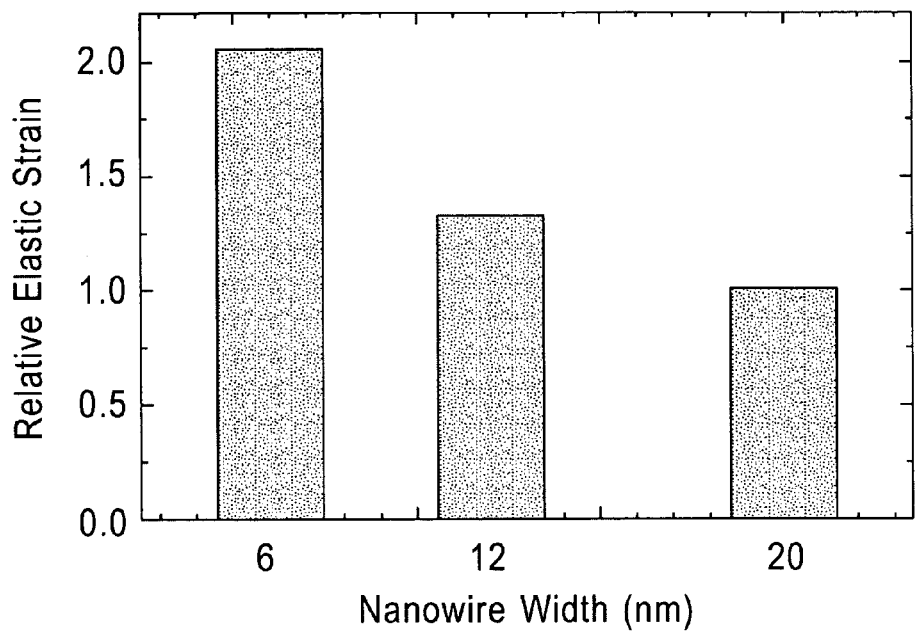
FIG. 4A is a graph showing effect of nanowire thickness on relative strain and FIG. 4B is a plot or strain to ratio of gate dielectric to channel thickness.

As will be quantitatively detailed below, it is the tensile or compressive force exerted on the channel by the gate stack that causes the increased conductance in the channel. Therefore the ratio of the material thicknesses involved (channel versus gate stack) has a direct bearing on just how pronounced the effect becomes; a relatively large channel may be compressed or expanded at its surface to some negligible extent by the compressive or tensile force exerted by the gate stack, but the mobility difference due to the compressive or tensile force would be negligible (if measureable at all) with a large channel 300 since the majority of the material along a cross section of that channel 300 remains beyond the influence of the compressive/tensile force from the gate stack. This is exactly the arrangement in prior art CMOS (complementary metal-oxide semiconductor) and finFET devices; even at a 1 micron width the channel is too bulky for an external compressive or tensile influence from the prior art gate stacks (with thickness about 1-2 nm) to be appreciable. Any stress/strain transfer from gate to channel that would occur in such an arrangement is simply too slight in the relatively bulky channel to have an appreciable impact on electron/hole mobility. This is shown at FIG. 4A: larger thickness nanowires exhibit a lesser relative elastic strain than their more narrow counterparts.

Therefore, one consideration for the electron/hole mobility through the channel to increase more than a negligible amount due to compressive/tensile force exerted by the gate stack is to control the ratio of channel bulk to gate stack bulk. Further details of controlling this ratio are detailed in the application cross-referenced and incorporated above.

Figure 1A:
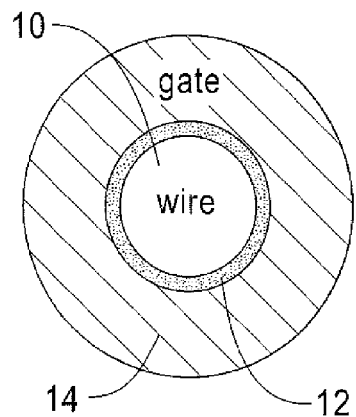
FIG. 1A is a schematic sectional view of a nanowire.
Figure 1B:
FIG. 1B is a micrograph of several nanowires which are connected to form one channel (in parallel).
Figure 1C:
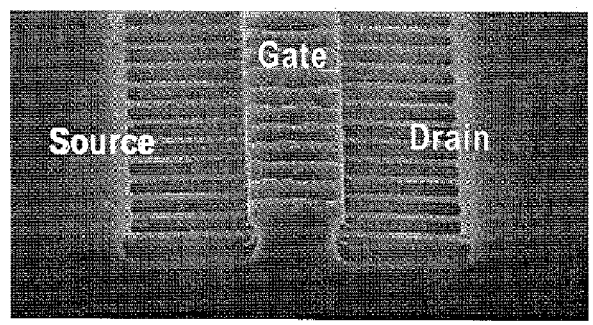
FIG. 1C is a micrograph of a nanowire transistor having a single gate.
Figure 1D:
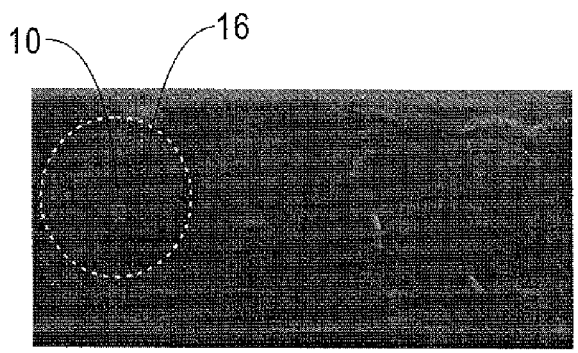
FIG. 1D is another micrograph of the cross-section through the gate and several nanowires from FIG. 1C.

The channel 300 has a length l (see FIG. 2B) and a thickness $t_C$, and the gate stack may be considered to have a thickness $t_G$. The thickness of the channel is measured perpendicular to the surface at which the tensile or compressive force is exerted from the gate dielectric/gate. For the case of a round channel 300 as in FIG. 1A, the channel thickness $t_C$ may be considered the diameter (or average diameter if not exactly round).

Figure 4B:
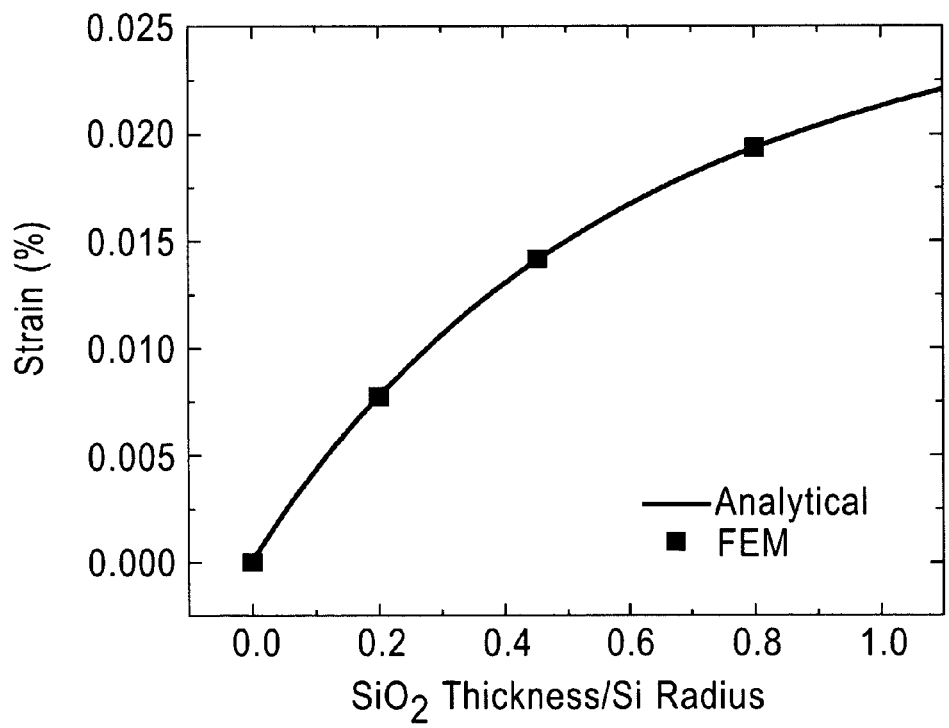

In an exemplary embodiment, the ratio of gate stack (or only the gate dielectric) to channel thickness $t_G/t_C$ is about 0.1 or more, and in a preferred embodiment the ratio is about 0.4 or 0.8 or more. Results for these ratios are shown at FIG. 4B, which plots relative strain for various ratios of $SiO_2$ (an exemplary gate dielectric film) to Si (an exemplary material for the channel). There it is seen that the relative strain is most pronounced at higher ratios of gate dielectric thickness to channel thickness. As the nanowire gets thicker (FIG. 4A) or the ratio gets smaller (FIG. 4B), the effect is diminished. While FIG. 4B is only the gate dielectric material and not the whole gate stack, a compressive or tensile gate material simply adds to the compressive or tensile force exerted on the channel by the gate dielectric. From the perspective of the nanowire channel, it matters not whether the compressive/tensile forces exerted on it are from a single gate dielectric layer or the full gate stack. From a design perspective, the gate stack is the relevant consideration since it is the entire stack that exerts a net compressive or tensile force on the channel; a compressive dielectric and a tensile gate for example will exert the net of those two forces on the channel.

From FIGS. 4A-4B it can be seen that as advances in CMOS technology have enabled fabrication of the channel on the order of tens of nms while the gate stack thickness has not scaled as aggressively, the channel no longer has sufficient bulk to mitigate surface stresses and strains; those surface forces now penetrate farther into the thickness of the channel on a percentage basis, and their influence on electron/hole mobility is more pronounced when the underlying channel has such a reduced cross section.

Additionally, simply applying a compressive or tensile force to the channel 300 via the gate stack is alone insufficient to increase mobility properly. As will be seen at FIG. 7 for different p-FET embodiments, doing so without the proper crystalline alignment (Miller index) can actually reduce electron/hole mobility. We get to those specific conclusions by proceeding through FIGS. 5-8.

A piezoelectric effect is the ability of different materials to generate an electric potential under a mechanical deformation. One measure of just how much potential can be generated under the stress is termed a piezoelectric coefficient, sometimes termed a piezoelectric constant. Its units are those of inverse pascals (a pascal being a unit of stress). Semiconductor materials traditionally have small piezoelectric coefficients. But when considering a channel which measures on the order of nanometers, even a small deformation to the crystal structure can create a large change in mobility because of the relative amounts of stress being large in such small structures.

Because the molecular structure of silicon is crystal rather than random, the piezoelectric coefficient differs in the different crystalline directions. FIG. 5A gives piezoelectric constants for a channel 300 formed of bulk silicon with its length aligned in the <110> direction, like the n-FET 212 shown at FIG. 2B. There are three different coefficients for the different surfaces of the nanowire channel for three different directions: $\pi_L$ is the piezoelectric constant for deformation along the length direction which is the <110> orientation; $\pi_V$ is the piezoelectric constant for deformation along the vertical direction perpendicular to the length direction which is the <001> orientation; and $\pi_T$ is the piezoelectric constant for deformation along the transverse direction which is the <110> orientation. FIGS. 6A-6B illustrate the surfaces and orientations, with Cartesian coordinates aligned as Z along the length, X along the transverse and Y along the vertical (regardless of Miller orientation).

FIG. 5B is similar to FIG. 5A, but shows the piezoelectric coefficients when the length of the channel is aligned with the <100> orientation and so the length is aligned with the <110> orientation, the vertical is aligned with the <001>orientation, and the transverse is aligned with the <110> orientation. The data in FIGS. 5A-5B will differ if the channel were made from other than Si. For both FIGS. 5A-5B, a negative value indicates compression deformation and a positive value indicates tension/expansion deformation.

At FIG. 6A the quantitative change in mobility is shown for the channel 300 having its length oriented in the <110> direction such as the n-FET 212 shown at FIG. 2C, and so the piezoelectric coefficients of FIG. 4A are the relevant ones. The overall equation $$\delta\mu/\mu = -\pi_T\sigma_T - \pi_V\sigma_V - \pi_L\sigma_L \quad [1]$$

tells that the (dimensionless) change in mobility $\delta\mu/\mu$ is the sum of the stress $\sigma$ (in MPa) multiplied by the piezoelectric coefficient $\pi$ for the various directions T, V and L (which in any individual FET embodiment align with Cartesian coordinates X, Y and Z as illustrated by example at FIGS. 6A-6B). The change reflects change in a stressed nanowire versus an unstressed nanowire.

FIG. 6B is similar to FIG. 6A but showing the alignment and Miller indices for the nanowire oriented with its length along the <100> direction, and so for this calculation the piezoelectric coefficients given at FIG. 4B are relevant.

FIG. 7 summarizes the total change in mobility for the entire nanowire of cross section measurements 20 nm by 20 nm. The total is obtained by computing equation [1] above for each of the four surfaces and summing the four results. Top and bottom T/B surfaces are identical since their orientation is the same and the nanowire section is square and so only one needs to be explicitly computed, and the same applies to the left/right L/R surfaces of that same nanowire. The equation to find the change in mobility of the stressed versus unstressed 20×20 nanowire is then $$\delta\mu_{20\times20} = 0.5(\delta\mu_{T/B} + \delta\mu_{L/R}). \quad [2]$$

Figure 5C:
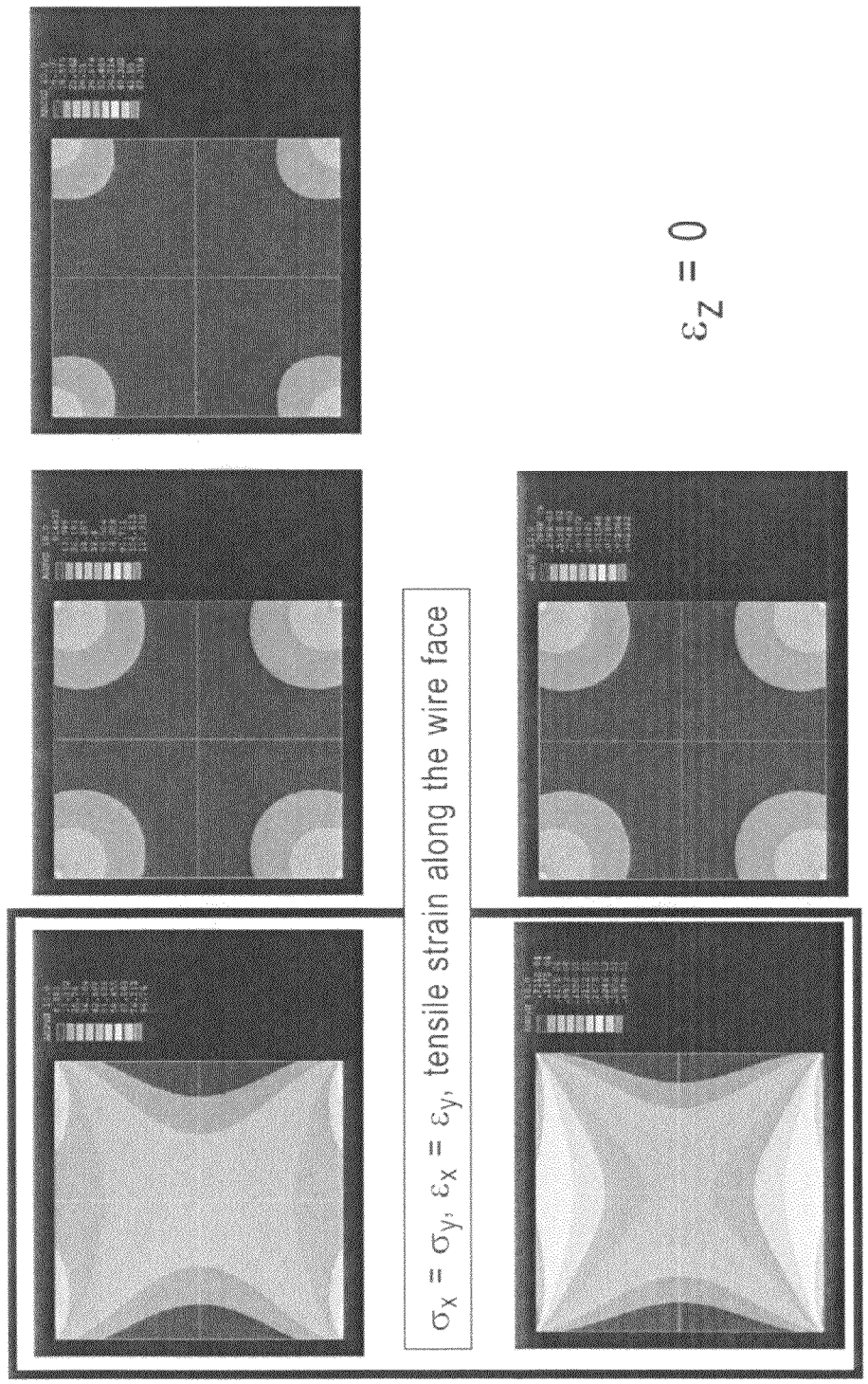
FIG. 5C is a numerical simulation of strain in a square 20 nm×20 nm channel.

Using the values from FIG. 5A for the <110> orientation and from FIG. 5B for the <100> orientation yields the results shown at FIG. 7 for an n-FET embodiment and for a p-FET embodiment when the gate stack is compressive. The stress values come from stress modeling of a sample nanowire such as the 20 nm×20 nm shown at FIG. 5C. Note that for the n-FET embodiment, mobility decreases as compared to the unstressed nanowire. For the p-FET embodiment, mobility decreases slightly when the channel length is oriented on the <100> direction as shown at 214 of FIG. 2B, but increases when the channel length is oriented in the <110> direction as shown at 212 of FIG. 2B. Thus a p-FET gate stack selected to impose a compressive force on the nanowire channel having its length oriented in the <110> direction increases mobility.

Using the values from FIG. 5A for the <110> orientation and from FIG. 5B for the <100> orientation and the stress values from FIG. 5C yields the results shown at FIG. 8 for an n-FET embodiment and for a p-FET embodiment when the gate stack is tensile. Note that for the n-FET embodiment, mobility increases in both orientations, opposite the effect of the compressive film results at FIG. 7. For the p-FET embodiment, mobility increases slightly when the channel length is oriented on the <100> direction as shown at 214 of FIG. 2B, but decreases quite a bit when the channel length is oriented in the <110> direction as shown at 212 of FIG. 2B. Thus the greatest mobility gain for the tensile films is seen for the case that an n-FET gate stack is selected to impose a tensile force on the nanowire channel having its length oriented in the <100> direction. A reasonable increase is also achieved for that same n-FET with the channel length oriented in the <110> direction.

Generally, an individual semiconductor chip includes many thousands or even hundreds of thousands of transistors and other CMOS devices. There are many considerations in how to arrange these relative to one another on the chip not least of which is high density to decrease manufacturing cost, but it can be appreciated that where possible in view of other competing considerations a single chip may take advantage of both the n-FET and the p-FET mobility increases noted above.

So in an exemplary embodiment of the invention there is an electronic device that includes a conductive channel defining a crystal structure and having a length and a thickness $t_C$; and a dielectric film in contact with a surface of the channel. The dielectric film has a thickness $t_G$ such that the ratio $t_G/t_C$ is greater than or equal to 0.1. The film is made from a material that (or more than one material whose combined effect) exerts one of a compressive or a tensile force on the contacted surface of the channel such that when a voltage is applied across the channel, electrical mobility (holes and electrons) along the channel length is increased due to the compressive or tensile force in dependence on alignment of the channel length relative to the crystal structure.

In the specific examples above, such an electronic device is a transistor, the dielectric film includes a gate stack having at least a gate dielectric, and the conductive channel includes a nanowire having the thickness $t_C$ less than or equal to about 20 nanometers.

For the case where the transistor is of the n-FET type, the channel length is substantially aligned with a <100> Miller index of the crystal structure, the gate stack exerts a tensile force on the contacted surface of the channel, the gate dielectric comprises at least one of tensile oxynitride and hafnium oxide (HfO$_2$), and/or the gate of the gate stack comprises at least one of titanium nitride (TiN), tantalum nitride (TaN) and tensile polysilicon.

For the case where the transistor is of the p-FET type, the channel length is substantially aligned with a <110> Miller index of the crystal structure, the gate stack exerts a compressive force on the contacted surface of the channel, the gate dielectric comprises at least one of thermal oxide and compressive oxynitride, and/or the gate of the gate stack comprises at least polysilicon.

To get a more pronounced effect, the example show the gate disposed about the entire outer surface of a cross section of the channel, but the invention may be practiced with only one surface (e.g., top) of the channel contacted, or two or three. To the extent the channel may not be square, it may be stated more generically that a significant effect may be gained when the surface of the channel contacted by the dielectric film spans at least 50% of an outer surface of a cross section of the channel.

As was noted above, both n-FET and p-FET embodiments may be employed on a single semiconductor chip. Such a chip would include, in an exemplary embodiment, a first n-type transistor having a first channel and a first gate stack in contact with a surface of the first channel, where the first channel has a length $l_1$ along a first orientation of a crystal structure of the semiconductor chip and a thickness $t_{C1}$; and the chip also has a second p-type transistor having a second channel and a second gate stack in contact with a surface of the second channel, the second channel having a length $l_2$ along a second orientation of a crystal structure of the semiconductor chip and a thickness $t_{C2}$. In such a chip embodiment, the first gate stack exerts a tensile force on the contacted surface of the first channel such that when a voltage is applied across the first channel, electrical mobility along the first channel length $l_1$ is increased due to the tensile force in dependence on the first orientation. Further in this same exemplary chip embodiment, the second gate stack exerts a compressive force on the contacted surface of the second channel such that when a voltage is applied across the second channel, electrical mobility along the second channel length $l_2$ is increased due to the compressive force in dependence on the second orientation.

Such an exemplary semiconductor chip may have the semiconductor chip, the first channel and the second channel made of (bulk) silicon, and/or the first orientation is substantially along a <100> Miller index while the second orientation is substantially along a <110> Miller index.

Now with reference to FIGS. 9A-9L is described an exemplary process for making the n-FET and the p-FET on a single chip according to these teachings. It is noted that only the n-FET or only the p-FET may also be made, individually or as a transistor type-specific group without manufacture of the other transistor type, according to these same details. In these figures both a top view and a side view of the same process step are shown in top and bottom positions, respectively, of the drawings. N-FET is at the left and p-FET is at the right, as labeled. While the process is detailed with respect to one n-FET and one p-FET, it is understood that similar processing may occur simultaneously, in the same process steps, for multiple n-FETs and p-FETs on the same chip and preferably on all chips of the same wafer.

FIG. 9A begins with a nanowire 900 disposed over a buried oxide BOX layer 901 with a cavity 902 therebetween. The BOX layer 901 overlies a bulk silicon layer. The nanowire may be created and then partially released from the BOX in wet or dry hydrofluoric acid (HF). At FIG. 9B over both the n-FET and the p-FET is deposited a conformal oxide 903

(e.g., via low temperature oxide LTO, chemical vapor deposition CVD, plasma enhanced CVD, spin-on glass), and over that conformal layer 903 is then disposed a photo-resist layer 904 over the n-FET, leaving the p-FET lithographically opened/exposed. Then using wet or dry HF the oxide is removed from over the p-FET, completely releasing the nanowire 900. The HF has no effect on the n-FET due to the photo-resist 904.

At FIG. 9C is seen that the photo-resist is removed from the n-FET, and a compressive gate dielectric material 905 is disposed about the nanowire 900 of the p-FET. This can be done by growing (e.g., thermal oxide, oxynitride) or deposition. A layer of compressive material is deposited over both n-FET and p-FET, a photo-resist material 904 is deposited so as to define the gate 910 over the p-FET, and at FIG. 9D all of the compressive material 905 is etched away except for what lies under the photo-resist 904. This forms the p-FET gate 910. The photo-resist 904 over that gate is then removed.

Figure 9E:
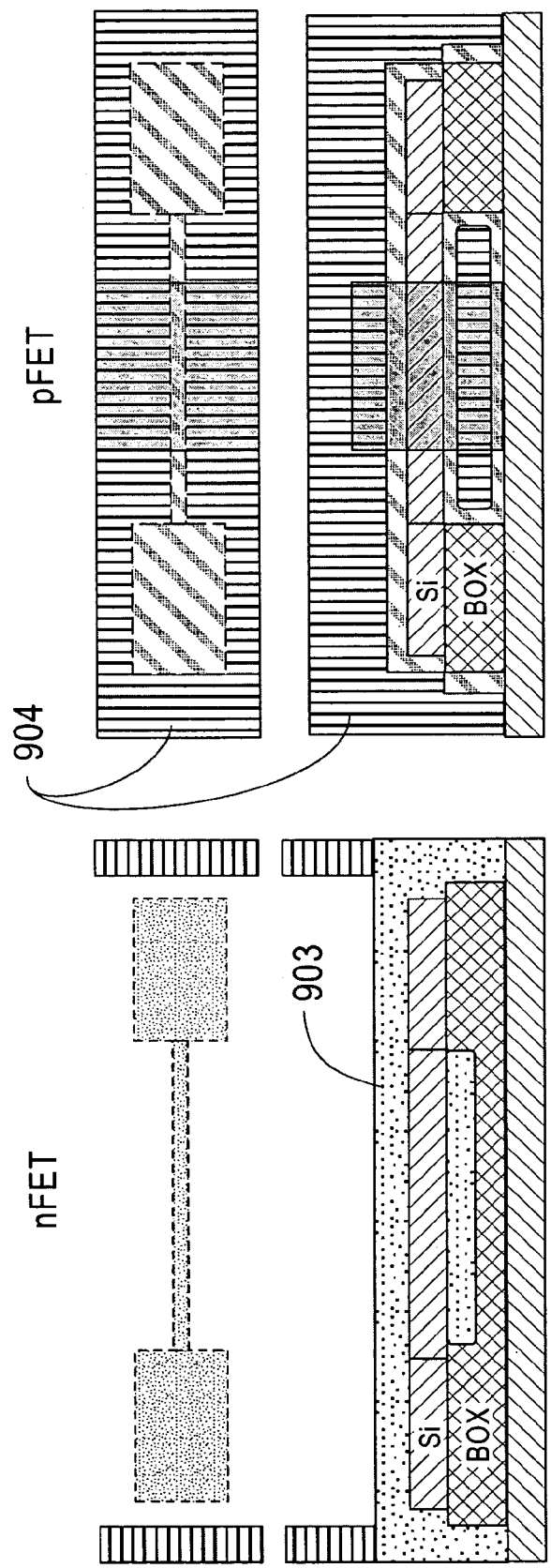
Figure 9F:
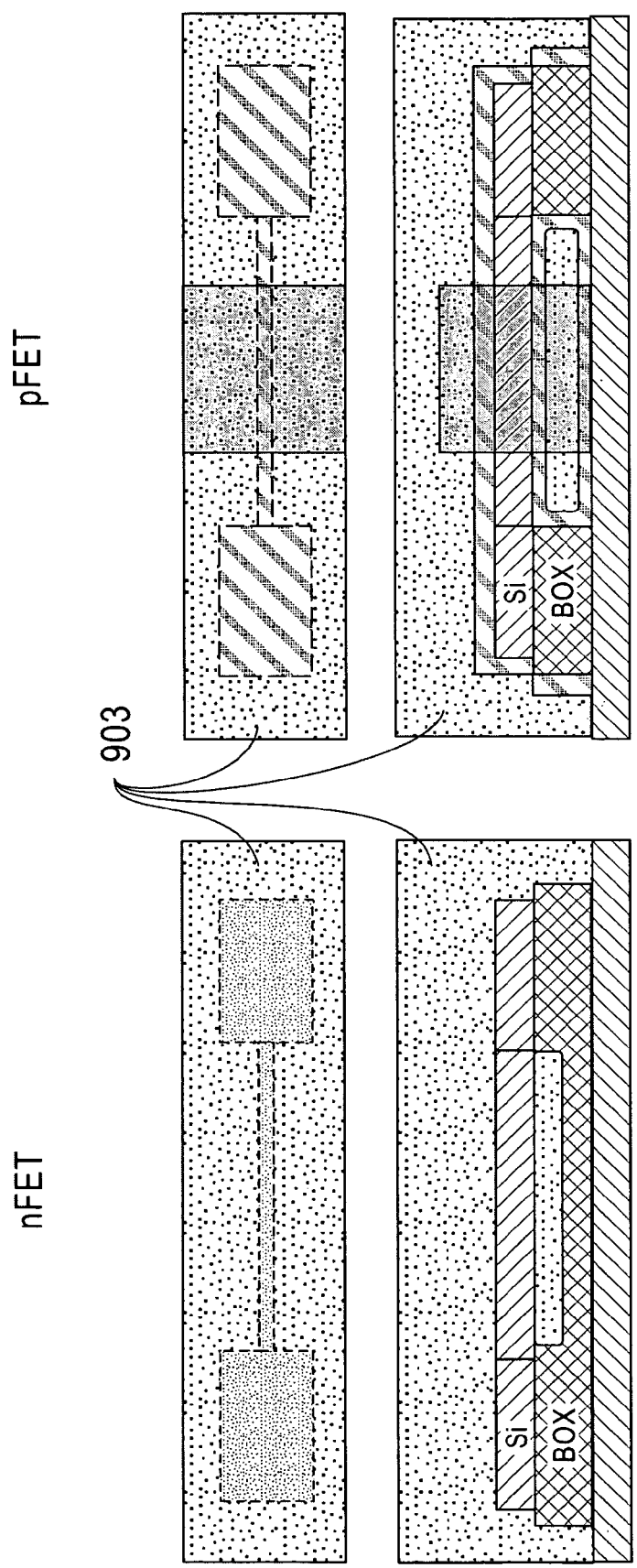

At FIG. 9E we begin forming the n-FET by depositing a layer of photo-resist over the p-FET so as to open up the n-FET for processing. This photo-resist layer prevents the p-FET from lifting off the substrate when the silicon oxide/nitride layer 903 is removed next. The silicon oxide/nitride layer 903 still overlies the n-FET, so that layer 903 is removed prior to stripping from the p-FET the photo-resist 904. From there, another conformal oxide or nitride layer 903 is deposited at FIG. 9F over both n-FET and p-FET. Whereas oxide is preferable in the earlier step, nitride is preferable at this step.

Figure 9G:
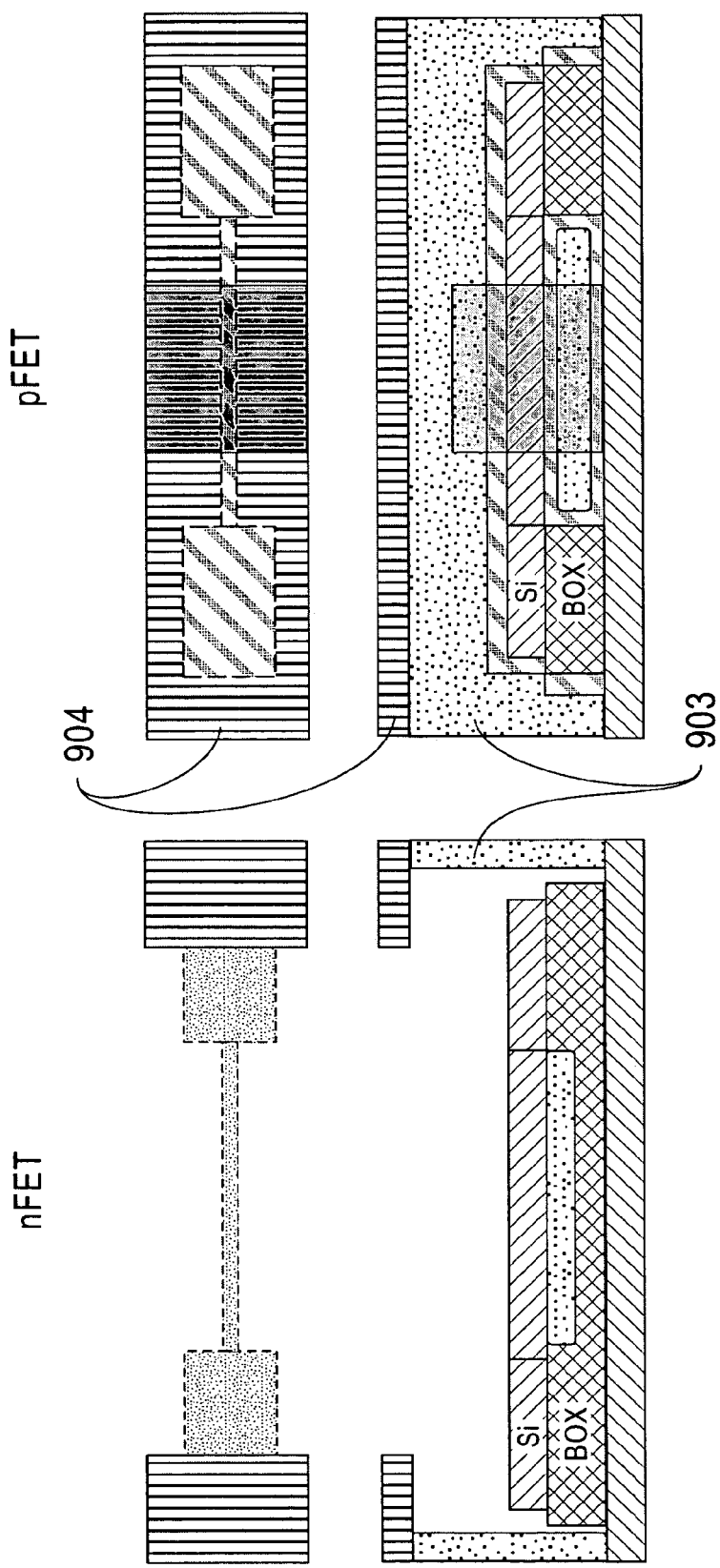
Figure 9H:
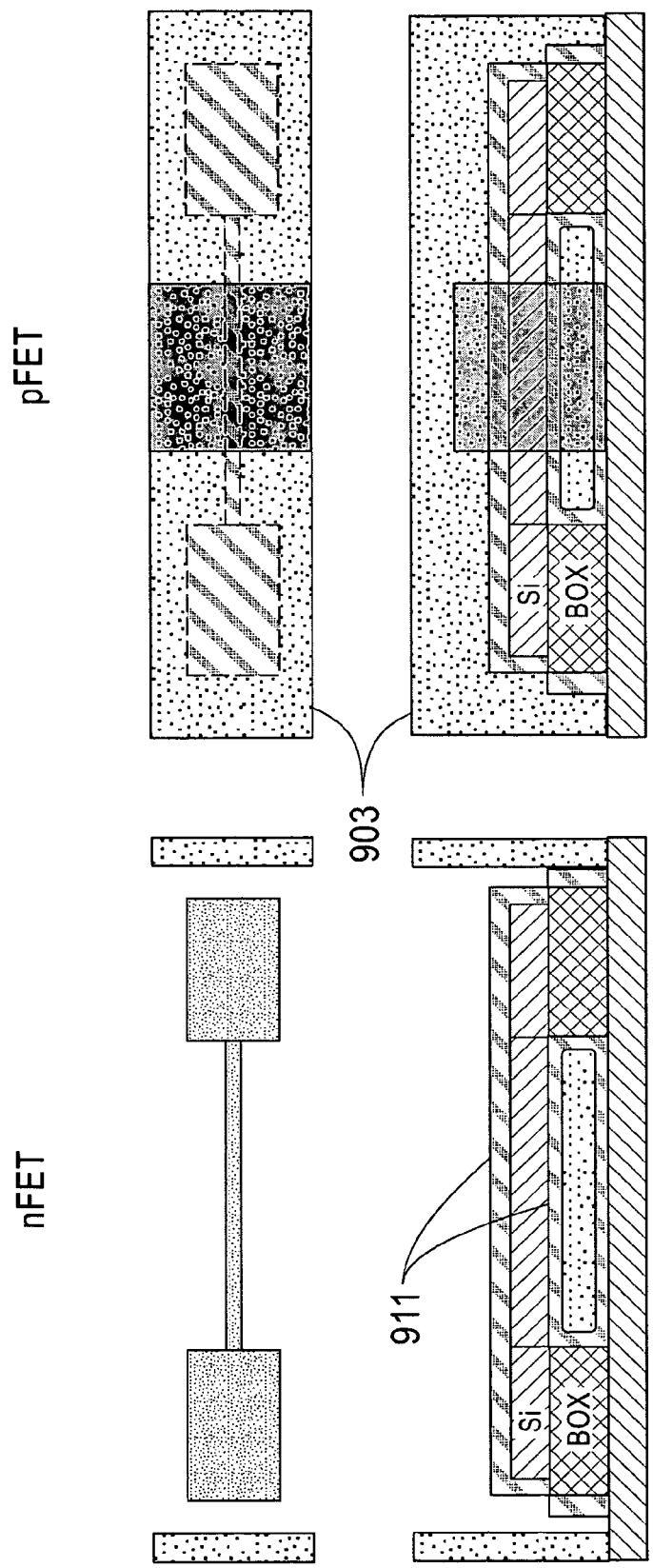
Figure 9I:
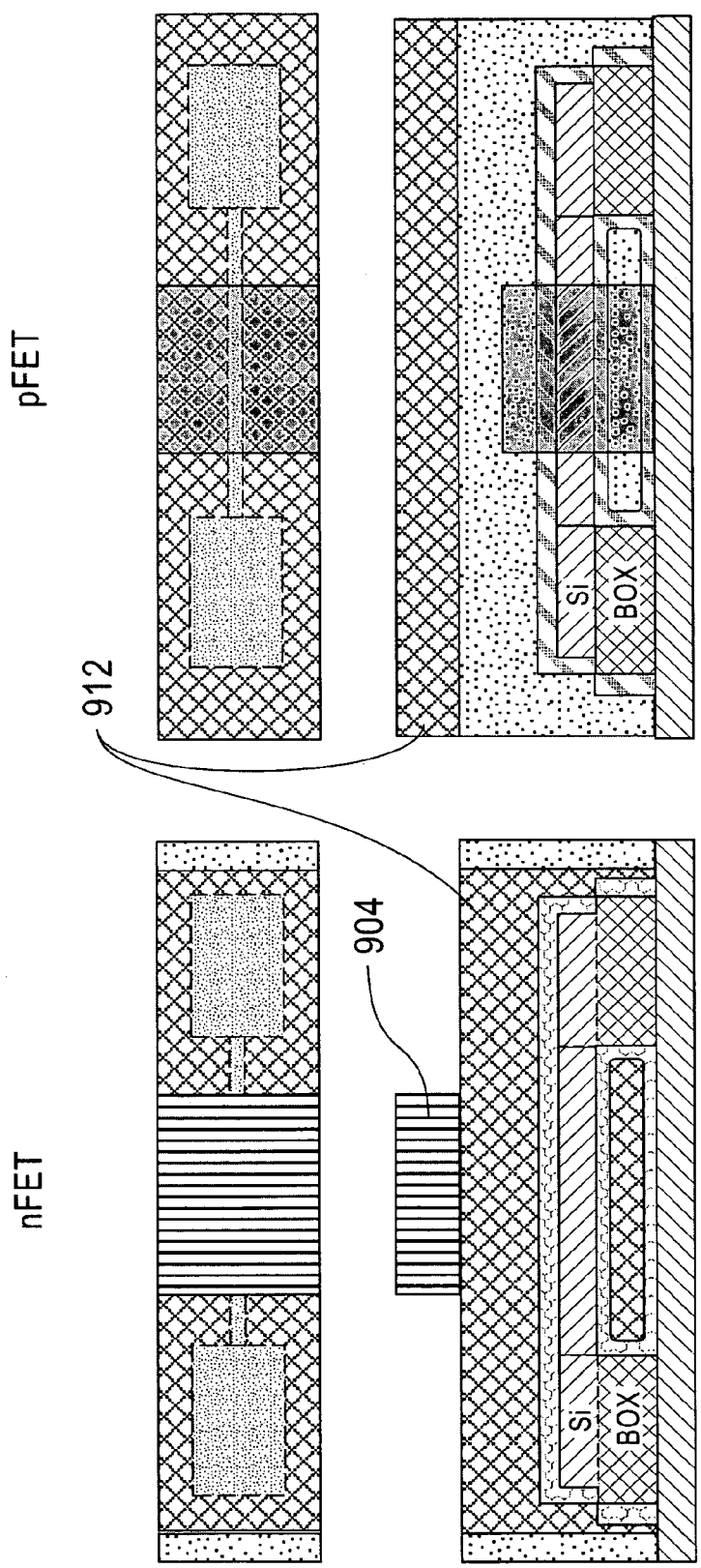

At FIG. 9G another photo-resist layer 904 is disposed over the p-FET to enable n-FET processing, which then includes removing the nitride layer 903 from the n-FET. At FIG. 9H the photo-resist is removed from over the p-FET and a tensile gate dielectric material 911 is disposed on the p-FET nanowire channel (e.g., grown such as tensile oxynitride or deposited such as $HfO_2$). At FIG. 9I a layer of tensile material 912 is deposited over both the n-FET and the p-FET, a layer of photo-resist 904 is deposited over all, and all of the photo-resist is removed except that to define a gate over the n-FET.

Figure 9J:
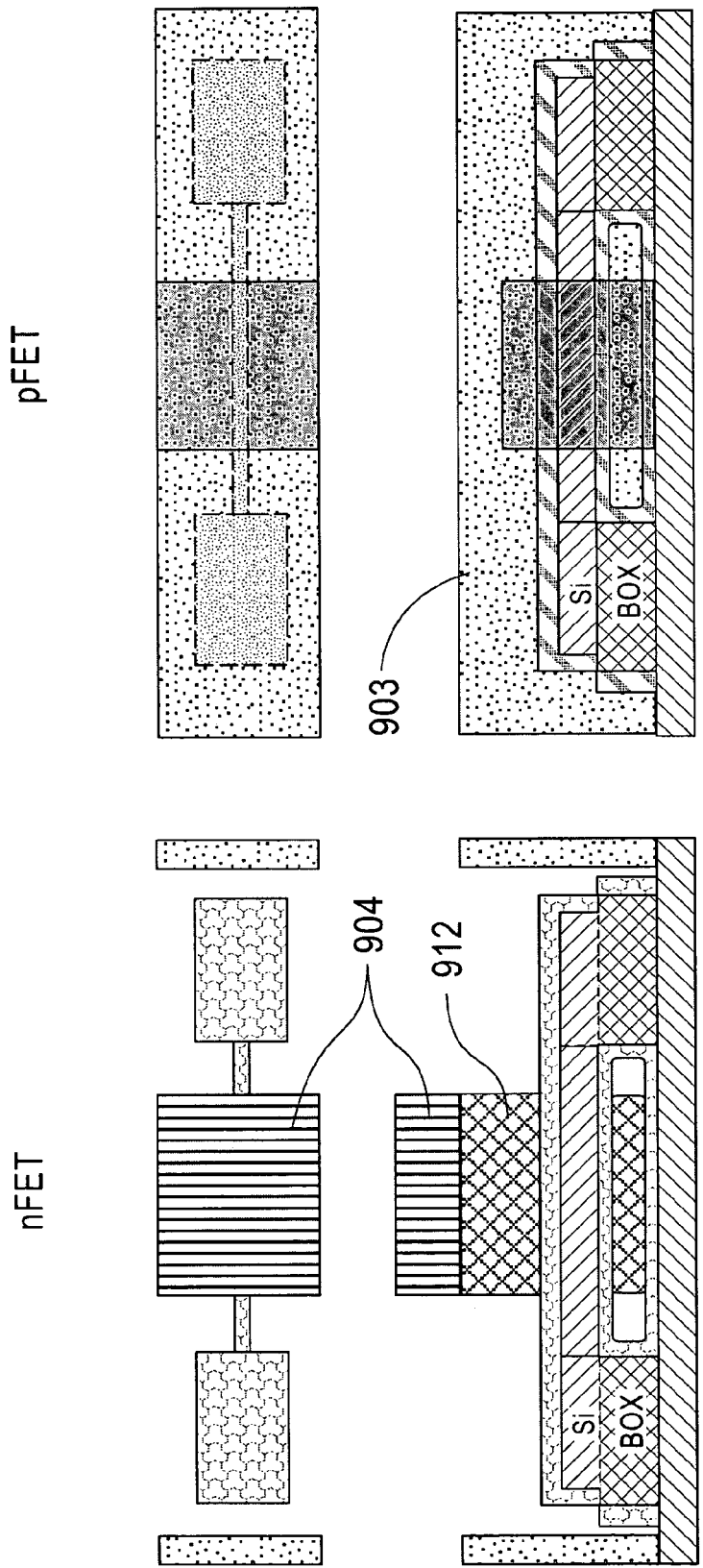
Figure 9K:
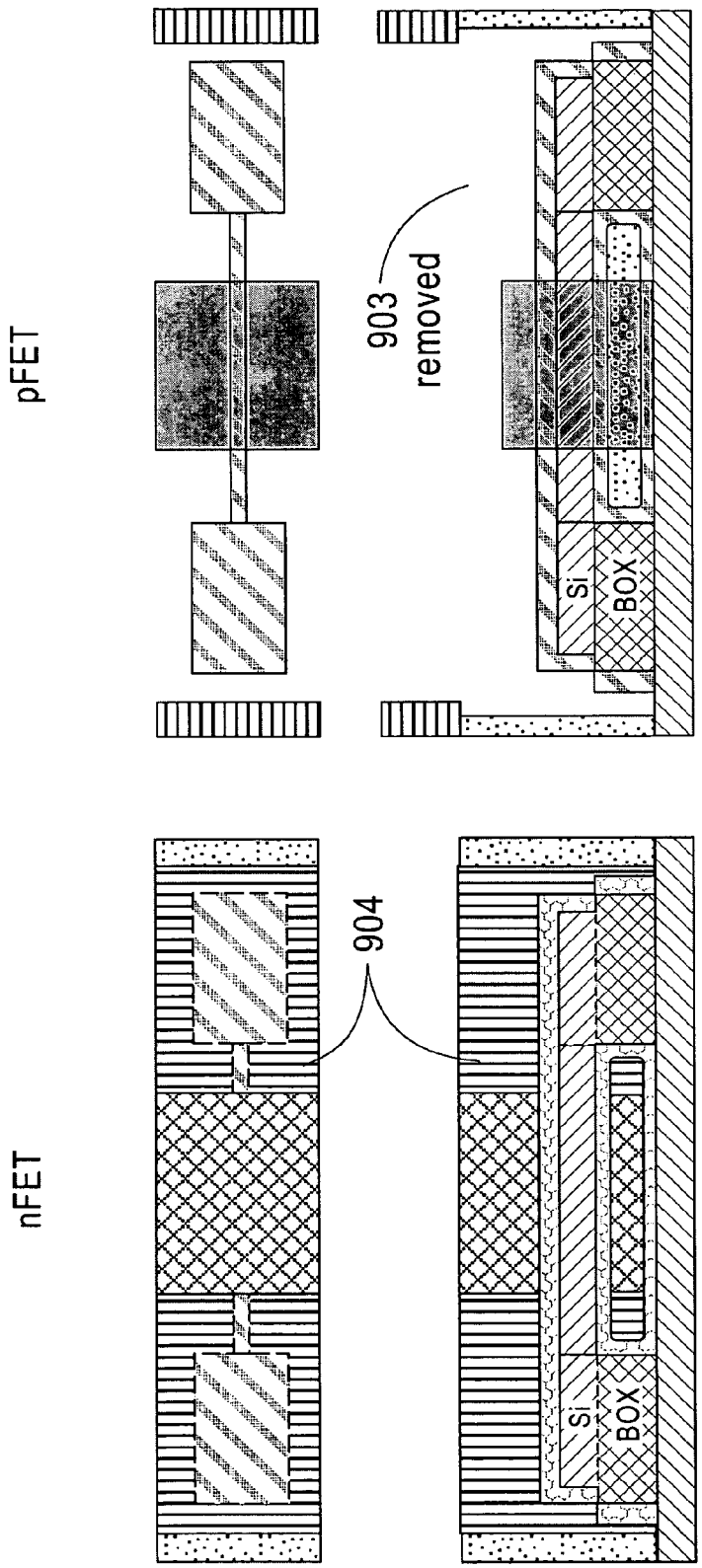

At FIG. 9J all of the tensile material 912 is stripped away except that protected by the remaining photo-resist 904. At FIG. 9K, a layer of photo-resist is disposed over both n-FET and p-FET, and then removed from over the p-FET after which the nitride layer 903 is removed from the p-FET. If this layer 903 is nitride, then instead of the resist layer being deposited here a hard mask, such as oxide can be used then a resist stack on top of the conformal oxide/nitride (for selectivity).

Figure 9L:
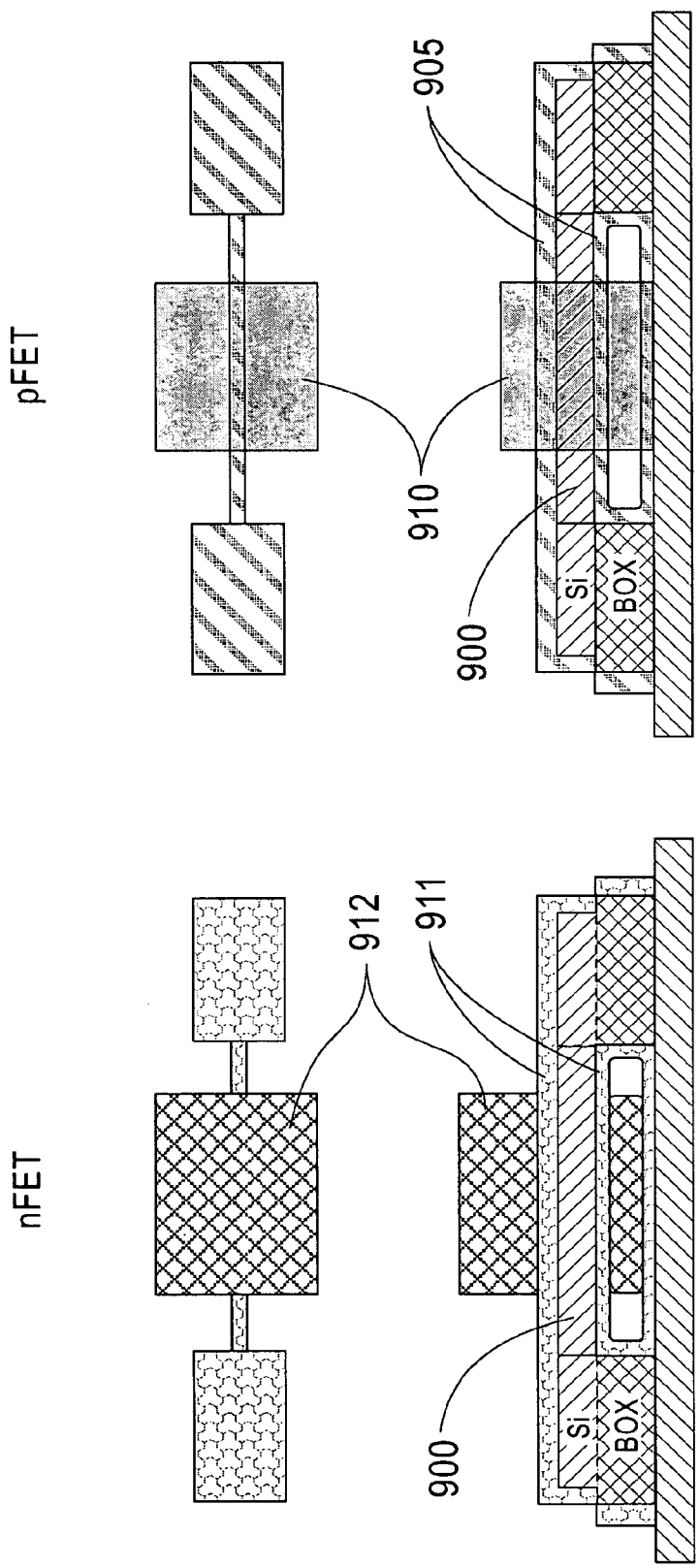

FIG. 9L shows the final chip after the photo-resist/mask layer 904 is removed. This Figure shows that the n-FET and p-FET gate stacks may be of different height, which may be exploited to tailor the stress or simply to deal with different types of gate material. To summarize, FIG. 9L shows the p-FET a nanowire 900 with a compressive gate dielectric 905 and a compressive gate 910, and a n-FET nanowire 900 with a tensile gate dielectric 911 and a tensile gate 912.

The above devices and methods are exemplary only and not limiting to the ensuing claims. Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. An electronic device comprising:
   a conductive channel defining a crystal structure, the conductive channel having a channel length, an alignment of the channel length relative to the crystal structure and a channel thickness $t_C$; and
   a dielectric film in contact with a surface of the channel, the dielectric film having a film thickness $t_G$,
   wherein a ratio $t_G/t_C$ is greater than or equal to 0.1,
   the dielectric film comprises a material that exerts one of a compressive or a tensile force on the contacted surface of the conductive channel, and,
   when a voltage is applied across the channel the compressive or tensile force and the alignment of the channel length increase electrical mobility of carriers along the channel length wherein the electronic device comprises a transistor, the dielectric film comprises a gate stack having at least a gate dielectric, and the conductive channel comprises nanowire having a thickness $t_C$ less than or equal to about 20 nanometers, and wherein the transistor comprises one of an n-FET and a p-FET, and the channel length is substantially aligned with one of a <100> Miller index of the crystal structure and <110> Miller index of the crystal structure.

2. The electronic device of claim 1, wherein the gate stack exerts a tensile force on the contacted surface of the channel.

3. The electronic device of claim 1, wherein the gate dielectric comprises at least one of tensile oxynitride and halfnium oxide (HfO2).

4. The electronic device of claim 1, wherein the gate stack comprises a gate dielectric and a gate, and wherein the gate comprises at least one of titanium nitride (TiN), tantalum nitride (TaN) and tensile polysilicon.

5. The electronic device of claim 1, wherein the gate stack exerts a compressive force on the contacted surface of the channel.

6. The electronic device of claim 1, wherein the gate dielectric comprises at least one of thermal oxide and compressive oxynitride.

7. The electronic device of claim 1, wherein the gate stack comprises a gate dielectric and a gate, and wherein the gate comprises at least polysilicon.

8. The electronic device of claim 1, wherein the surface of the channel contacted by the dielectric film spans at least 50% of an outer surface of a cross section of the channel.

9. An electronic device comprising:
   a conductive channel defining a crystal structure, the conductive channel having a channel length, an alignment of the channel length relative to the crystal structure and a channel thickness $t_C$; and
   a dielectric film in contact with a surface of the channel, the dielectric film having a film thickness $t_G$,
   wherein a ratio $t_G/t_C$ is greater than or equal to 0.1,
   the dielectric film comprises a material that exerts a tensile force on the contacted surface of the conductive channel,
   when a voltage is applied across the channel, the tensile force and the alignment of the channel length increase electrical mobility of carriers along the channel length,
   the electronic device comprises a transistor,
   the transistor comprises a n-FET,
   the dielectric film comprises a gate stack having at least a gate dielectric,
   the conductive channel comprises a nanowire having the thickness $t_C$ less than or equal to about 20 nanometers, the alignment of the channel length relative to the crystal structure is substantially aligned with a <100> Miller index of the crystal structure, and the gate dielectric comprises at least one of tensile oxynitride and halfnium oxide (HfO2).

10. An electronic device comprising:

a conductive channel defining a crystal structure, the conductive channel having a channel length, an alignment of the channel length relative to the crystal structure and a channel thickness $t_C$; and a dielectric film in contact with a surface of the channel, the dielectric film having a film thickness $t_G$, wherein a ratio $t_G/t_C$ is greater than or equal to 0.1, the dielectric film comprises a material that exerts a compressive force on the contacted surface of the conductive channel, when a voltage is applied across the channel, the compressive force and the alignment of the channel length increase electrical mobility of carriers along the channel length, the electronic device comprises a transistor, the transistor comprises a p-FET, the dielectric film comprises a gate stack having at least a gate dielectric, the conductive channel comprises a nanowire having the thickness $t_C$ less than or equal to about 20 nanometers, the channel length is substantially aligned with a <110> Miller index of the crystal structure, the gate stack comprises a gate dielectric and a gate, and the gate comprises at least polysilicon.

* * * * *

UNITED STATES PATENT AND TRADEMARK OFFICE
CERTIFICATE OF CORRECTION

PATENT NO. : 8,368,125 B2
APPLICATION NO. : 12/505580
DATED : February 5, 2013
INVENTOR(S) : Dureseti Chidambarrao et al.

It is certified that error appears in the above-identified patent and that said Letters Patent is hereby corrected as shown below:

On the Title Page, Item (74): Please delete "Louis J. Percello" and replace with --Vazken Alexanian--.

Signed and Sealed this
Sixteenth Day of July, 2013

Teresa Stanek Rea
*Acting Director of the United States Patent and Trademark Office*